(12) United States Patent
Raghavan et al.

(10) Patent No.: US 9,721,673 B1
(45) Date of Patent: Aug. 1, 2017

(54) DISTRIBUTED CURRENT SOURCE/SINK USING INACTIVE MEMORY ELEMENTS

(71) Applicant: GLOBALFOUNDRIES INC., Grand Cayman (KY)

(72) Inventors: Ramesh Raghavan, Bengaluru (IN); Balaji Jayaraman, Bengaluru (IN); Rajesh R. Tummuru, Bengaluru (IN); Thejas Kempanna, Bengaluru (IN); Janakiraman Viraraghavan, Bengaluru (IN)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/363,056

(22) Filed: Nov. 29, 2016

(51) Int. Cl.
*G11C 16/04* (2006.01)
*G11C 17/18* (2006.01)
*G11C 17/16* (2006.01)

(52) U.S. Cl.
CPC ............ *G11C 17/18* (2013.01); *G11C 17/165* (2013.01); *G11C 16/0466* (2013.01)

(58) Field of Classification Search
CPC .................................................. G11C 16/0466
USPC ....................................................... 365/185.28
See application file for complete search history.

(56) References Cited

U.S. PATENT DOCUMENTS

| 9,025,386 | B1 | 5/2015 | Iyer et al. | |
| 2005/0047208 | A1* | 3/2005 | Kanai | G11C 16/0466 365/185.11 |
| 2015/0138868 | A1 | 5/2015 | Castalino et al. | |

* cited by examiner

*Primary Examiner* — Hoai V Ho
(74) *Attorney, Agent, or Firm* — Yuanmin Cai; Hoffman Warnick LLC

(57) ABSTRACT

A Multi-Time-Programmable-Memory (MTPM) array architecture, whose structure comprising of having Metal-Oxide-Semiconductor Field-Effect-Transistor (MOSFET) memory elements arranged in a set of twin-pairs coupled by wordlines (WLs), bitlines (BLs) and sourcelines (SLs). More specifically, the use of inactive portions of the MTPM array structure as substitutes for conventional BL write driver areas by utilizing a set of twin-pairs acting in parallel. These substituted twin-pair sets will improve programming efficiency (VGS) and retention (VDS) through a lowering Interconnect (IR) drop and VDS drops at the BL write driver.

20 Claims, 7 Drawing Sheets

| Mode | Active WL | Inactive WL | BLT | BLC | SL |
|---|---|---|---|---|---|
| Program 1 | 2V | 0V | 0V | Float | 1.5V |
| Program 0 | 2V | 0V | Float | 0V | 1.5V |
| Erase | 0V | 0V | 2.5V | 2.5V | Float |
| Sense | 1V | | Sense | Sense | 1V |

| | 405 WL 1 | 406 WL 2 | 409 SL 1 | 410 SL 2 | 411 SL 3 | 407 & 408 BLT & BLC |
|---|---|---|---|---|---|---|
| PRG A | Sel VPP | All 0.8V | 1.5V | 0 | Float | Float |
| PRG B | All 0.8V | Sel VPP | 0 | 1.5V | Float | Float |
| PRG C | All 0.8V | Sel VPP | Float | 1.5V | 0 | Float |
| PRG D | Sel VPP | All 0.8V | Float | 0 | 1.5V | Float |

| | 405 WL 1 | 406 WL 2 | 409 SL 1 | 410 SL 2 | 411 SL 3 | 407 & 408 BLT & BLC |
|---|---|---|---|---|---|---|
| Read A or D | Sel 0.5V | All 0V | 0V | Float | 0V | Sense |
| Read B or C | All 0V | Sel 0.5V | Float | 0V | Float | Sense |
| Erase | All 0V | All 0V | Float | Float | Float | 2.5V |

FIG. 6

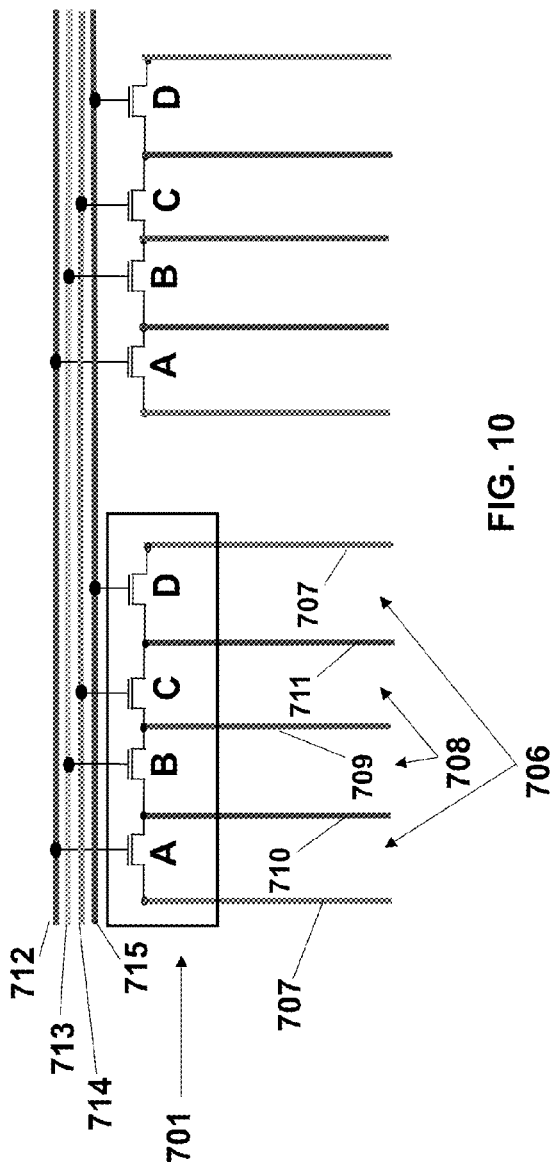

DISTRIBUTED CURRENT SOURCE/SINK USING INACTIVE MEMORY ELEMENTS

TECHNICAL FIELD

Aspects of the disclosure relate generally to memory structures of integrated circuits (ICs). More specifically, embodiments of the present disclosure relate to a semiconductor circuit, and particularly to a Multi-Time-Programmable-Memory (MTPM) array architecture, whose structure comprising of a memory circuit employing memory cells.

BACKGROUND

A conventional approach to implement a write driver for an embedded non-volatile memory, which is currently known in the art, is by having a two-stack NMOS circuit array. These write drivers/BL drivers help to pull the bitline (BL) to ground during the write or program operation of a MTPM device. A number of wordlines (WLs) could share this two-stack NMOS BL driver.

Accordingly using current technology, there is a limitation to the amount of WLs that are possible to include in the MTPM array, since the number of WLs are limited by the BL drop that is tolerable during the programming operations. Additionally, the conventional use of BL drivers used in these memory devices limits the space available for other components, and decreases the memory cell area efficiency.

Referring to FIGS. 1 and 2, a schematic diagram of an IC structure of a conventional twin-cell MTPM 101, and a table with modes of operation settings are shown. Conventional MTPMs utilize twin-cell architecture, where a twin-cell is composed of two transistors, via a true transistor, complement transistor, a true bitline (BLT) and a complement bitline (BLC). These components share a common sourceline (SL), with a second pair of twin-cells as shown in FIG. 1. Though only two twin-cells are shown, in principle, there could be many twin-cells sharing common SL, BLT and BLC. In the conventional structure, the MTPM is composed primarily of these aforementioned transistors and the aforementioned three tracks, BLT, BLC, and SL, and WLs driving the twin-cells. In order to accomplish a programming function, the system must (1) apply a high voltage (e.g., 2 V) to the WL, (2) apply a relatively high voltage (e.g., 1.5 V) to the SL and (3) drive a BL to ground. The write current is typically high (e.g., 1.5 mA) which results in significant bitline (BL) voltage drop. In comparison, under normal read operations the current is usually less than a few hundred μA (e.g., 300 μA). Furthermore, during conventional programming operations in one cell, the other cells are turned off by having their Wits set at 0V.

Referring to FIG. 3, a conventional 4×1 MTPM array 200 with four sets of twin-cells is shown. The conventional 4×1 MTPM array 200 with four sets of twin-cells, contains a series of four transistors, a BLT, a BLC, a SL, a first WL, a second WL and a bitline driver and multiplexer (MUX) 210. These BL drivers are comparatively large in size, and contribute toward the BL drop in the MTPM array 200 during programming. One bit of data (1/0) is stored in twin-cell by pulling either BLT (1) or BLC (0) to ground through the corresponding BL driver, and having the appropriate WL turned on at a high voltage. The worst case BL drop is seen by the twin-cell farthest from the BL driver, which sees the entire wire drop/IR drop along the BL, followed by the VDS drop at the BL driver.

SUMMARY

Accordingly, the present disclosure provides as solution for reducing BL drop by using an improved MTPM structure that replaces the coupled BL write drivers with portions of the MTPM's cell array to act as a BL driver. A first aspect is a MTPM device including: a first pair of twin-cell Metal-Oxide-Semiconductor Field-Effect-Transistors (MOSFETs) gate-coupled to a first wordline and a second pair of twin-cell MOSFETs gate-coupled to a second wordline; a true bitline drain-coupled to a first MOSFET in the first pair and source-coupled to a first MOSFET in the second pair; a complementary bitline source-coupled to a second MOSFET in the second pair and drain-coupled to a second MOSFET in the first pair; a first sourceline source-coupled to the first MOSFET in the first pair; a second sourceline drain-coupled to the first MOSFET in the second pair and source-coupled to the second MOSFET in the second pair; and a third sourceline drain-coupled to the second MOSFET in the first pair.

A second aspect of the present disclosure provides a MTPM device including: a first pair of twin-cell MOSFETs coupled to a first sourceline, wherein the first sourceline is source-coupled to a first MOSFET in the first pair and is further drain-coupled to a second MOSFET in the first pair; a second pair of twin-cell MOSFETs coupled to a second sourceline, wherein the second sourceline is drain-coupled to a first MOSFET in the second pair and is further source-coupled to a second MOSFET in the second pair; a first wordline gate-coupled to the first MOSFET in the first pair; a second wordline gate-coupled to the first MOSFET in the second pair; a third wordline gate-coupled to the second MOSFET in the second pair; a fourth wordline gate-coupled to the second MOSFET in the first pair; a true bitline drain-coupled to the first MOSFET in the first pair and source-coupled to the first MOSFET in the second pair, wherein the true bitline is set to float; and a complementary bitline drain-coupled to the second MOSFET in the second pair and source-coupled the second MOSFET in the first pair, wherein the complementary bitline is set to float.

A third aspect of the present disclosure provides a MTPM Matrix array including: a first pair of twin-cell Metal-Oxide-Semiconductor Field-Effect-Transistors (MOSFETs) gate-coupled to a first wordline and a second pair of twin-cell MOSFETs gate-coupled to a second wordline; a true bitline drain-coupled to a first MOSFET in the first pair and source-coupled to a first MOSFET in the second pair; a complementary bitline drain-coupled to a second MOSFET in the second pair and source-coupled to a second MOSFET in the first pair; a first sourceline source-coupled to the first MOSFET in the first pair; a second sourceline drain-coupled to the first MOSFET in the second pair and source-coupled to the second MOSFET in the second pair; and a third sourceline drain-coupled to the second MOSFET in the first pair.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 6 shows a table of the read and erase modes of operation according to embodiments of the present disclosure.

FIG. 10 shows a schematic diagram of an IC structure according to an alternative embodiment of the present disclosure.

FIG. 11 shows a table of the program modes of operation according to an alternate embodiment of the present disclosure.

Figures 1, 2:
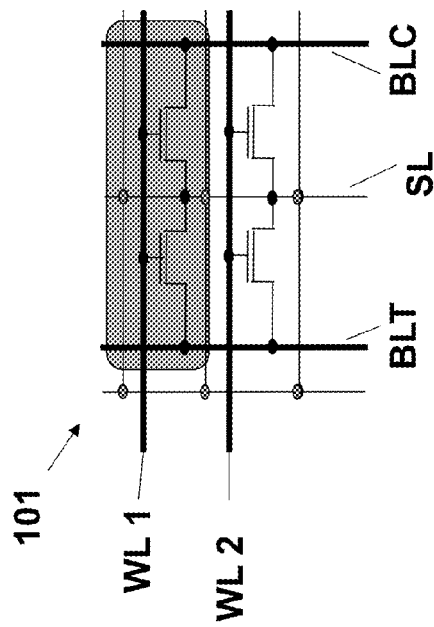
FIG. 1 shows a schematic diagram of an IC structure of a conventional twin-cell MTPM.
FIG. 2 shows a table of the modes of operation of a conventional twin-cell MTPM.
Figure 3:
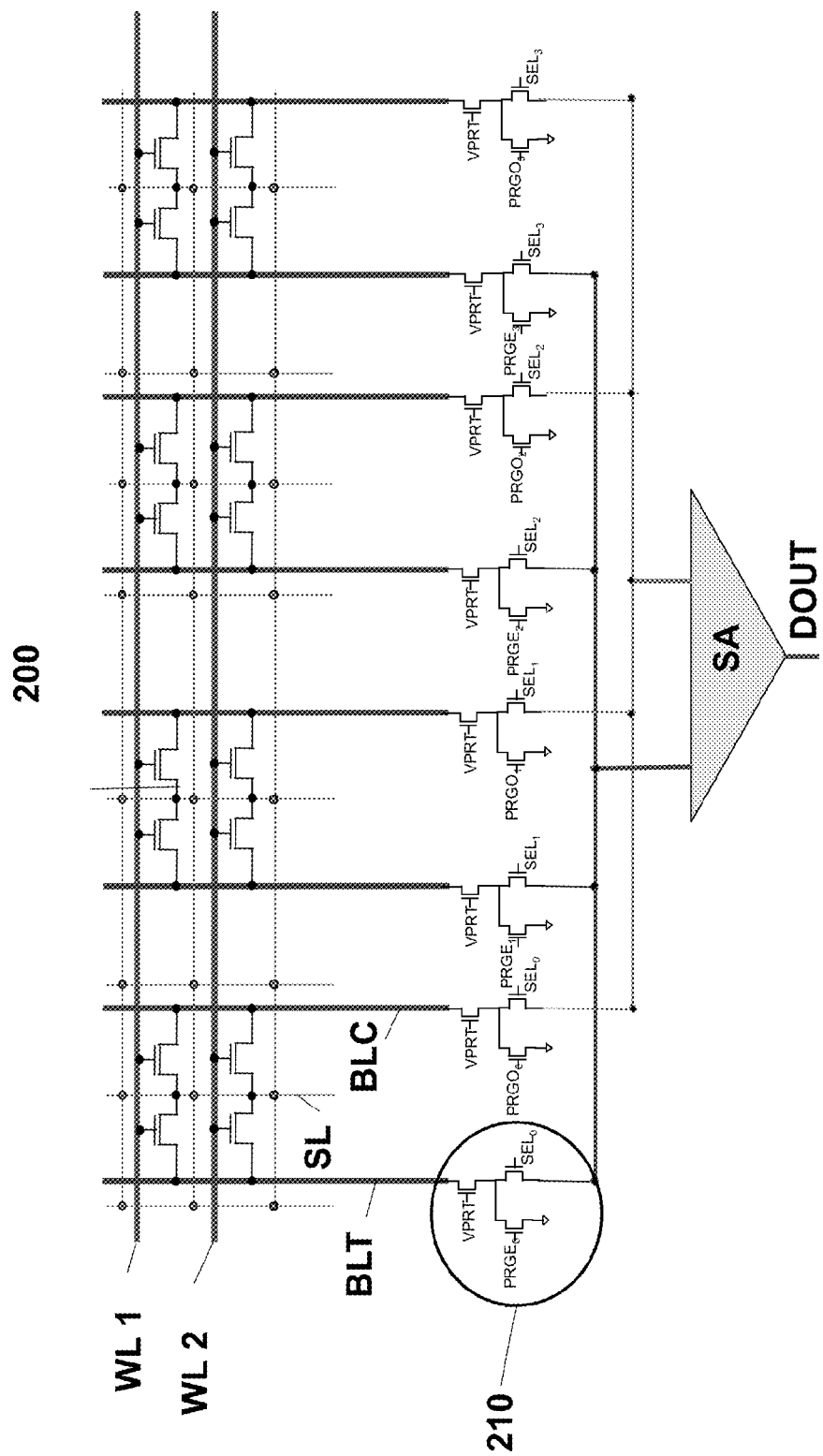
FIG. 3 shows a schematic diagram of an IC structure of a conventional twin-cell MTPM in an array.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present disclosure include MTPM structures and methods of improving programming efficiency and/or cell area efficiency. This is done through utilizing portions of the MTPM arrays that lay unused during the programming (writing) operation. By substituting those previously unused areas for the conventional BL write driver areas with sets of MOSFET twin-cell pairs acting in parallel, it is possible for these devices to sustain a larger amount of WLs. The structure of these devices can include multiple MOSFET memory storage elements directly electrically coupled by shared BLT/BLC and SL to other MOSFET memory storage elements to form twin-cell pairs. These inactive pairs may then act in parallel during programming to distribute the programming current across the BL thus bringing down the effective BL wire drop.

Alternative embodiments of the structure may also include multiple MOSFET memory storage elements directly electrically source-drain coupled by shared BLs and SLs to other MOSFET memory storage elements to form twin-cell pairs, and two of these twin-cell pairs will act in parallel as a twin-cell pair set. In this embodiment, each MOSFET memory storage element is driven by a separate WL.

As compared to conventional MTPMs, embodiments of the present disclosure described herein can offer several technical and commercial advantages, including the benefits of lower effective BL wire drop. The total BL drop is equal to the IR drop (caused by having a voltage drop as it passes through any resistive component) plus the VDS drop (voltage drop across the source and drain of a MOSFET device) at the BL driver. By lowering the total BL drop, the number of WLs are able to be increased causing a significant area savings on the BL driver for the same array density since the WL driver area is lower than the BL driver area. Since the IR drop dominates the VDS drop in conventional MTPM architecture, reduction of the IR drop is more significant for the overall reduction of the BL drop. A reduction of the BL drop has several advantages, including, but not limited to a possibility to construct a memory cell with a larger array size. Another advantage can be seen in cases where one wants to keep the array size static, the same array size will have improved efficiencies by having improved write efficiency (higher gate-to-source voltage (VGS)) and retention (higher drain-to-source voltage (VDS)).

Figures 4, 5:
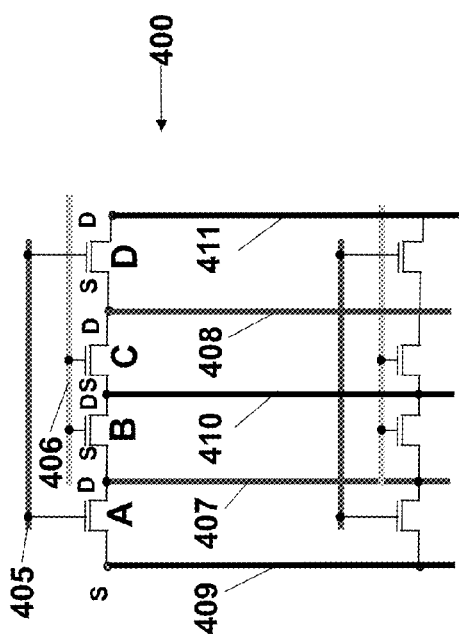
FIG. 4 shows a schematic diagram of an IC structure according to embodiments of the present disclosure.
FIG. 5 shows a table of the program modes of operation according to embodiments of the present disclosure.

Referring to FIG. 4, a schematic of a MTPM 400 utilizing twin-cell architecture is shown according to an embodiment of the present disclosure. MPTM 400 includes a series of four transistors or cells. The series may include a first cell A, a second cell B, a third cell C and a fourth cell D. This series of cells forms two twin-cells that are gate-coupled by either a first wordline 405, or a second wordline 406. A first twin-cell is shown with the first cell A and the fourth cell D gate-coupled by the first wordline 405. A second twin-cell is shown with the second cell B and third cell C gate-coupled by the second wordline 406. The node between the first cell A and the second cell B is either source or drain coupled to a true bitline 407, and the node between the third cell C and the fourth cell D is either source or drain coupled to a complement bitline 408. The structure also includes at least three SLs, a first sourceline 409, a second sourceline 410, and a third sourceline 411. In the present embodiment, MTPM 400 is thus composed of five tracks, the true bitline 407, the complement bitline 408, the first sourceline 409, the second sourceline 410, and the third sourceline 411. The plurality of SLs that compose these extra tracks allow the device to have all of the cells active during a program operation as exemplified in FIG. 5. The device as depicted generally represents a single embodiment of one device that may be configured in an array or matrix with the WLs as depicted by 405 and 406 being extended to include a plurality of elements or other architectures.

Referring to FIG. 5, a table of program settings according to an embodiment of the present disclosure is shown. MTPM 400 performs a programming operation in the first cell A 401 (PRG A) in response to a first programming voltage (VPP, e.g., 2 V) being applied to the first wordline 405, a second supply voltage (VDD, e.g, 0.8 V) being applied to the second wordline 406, a third voltage (e.g., 1.5 V) being applied to the first sourceline 409, a second sourceline 410 being set to ground, while the third sourceline 411, the true bitline 407 and the complement bitline 408 are being set to float. In this embodiment, the program operation is to be conducted on the first cell A 401 or the fourth cell D 404, when the second wordline 406 is driven to 0.8 V, the second sourceline 410 is pulled to ground through the multiple cells while acting as a BL driver for the device. The BL drop, as seen in first cell A 401 during this programming operation, is no longer along the entire BL, but would now be redistributed along the BL through the inactive cells, thereby reducing the worst-case BL wire drop by about 50%. As previously stated, in a program operation of a single twin-cell, the active WL will still be taken to a high voltage (e.g., 2 V), the SL will also be set at 1.5 V and the BL will be taken to ground with the high current (e.g., 1.5 mA.) However, unlike in the conventional case, this large current can be distributed over the multiple inactive twin cells by having their WLs turned on at a VDD voltage. Additionally, even if the VDS is low compared to the IR drop in the total BL drop analysis, since there is no extra BL driver needed in the other half of the array, there will be no VDS component to add which further lowers the total BL drop. Programming of cell B 402, cell C 403, and cell D 404, could also be carried out likewise by applying appropriate voltages as shown in FIG. 5.

Referring to FIG. 6, a table of read or erase settings according to an embodiment of the present disclosure is shown. In response to these settings, MTPM 400 (FIG. 4) may perform a read operation in the first cell 401, or the fourth cell 404 under the following conditions: there must be a selected voltage (Sel., e.g, 0.5 V) applied to the first wordline 405 while the second wordline 406, first sourceline 409, third sourceline 411 are set to ground, the second sourceline 410 being set to float with the differential voltage between the first bitline 407 and the second bitline 408 sensed. To further illustrate operational features, the read operation is similar to other twin-cell Ground Source Line (GSL) Based Sensing applications, as the BLs have to be initially pulled up to high before this read operation is to be performed.

As further shown in FIG. 6, MTPM 400 may perform an erase operation in response to the first wordline 405, and the second wordline 406 being set to ground, the first sourceline 409, the second sourceline 410, the third source line 411 being set to float, and a high voltage (e.g., 2.5 V) being applied to the true bitline 407 and the complement bitline 408. MTPM 400's erase operation may be consistent with other GSL based applications, and bulk erase operations are possible with the present embodiments.

Figure 7:
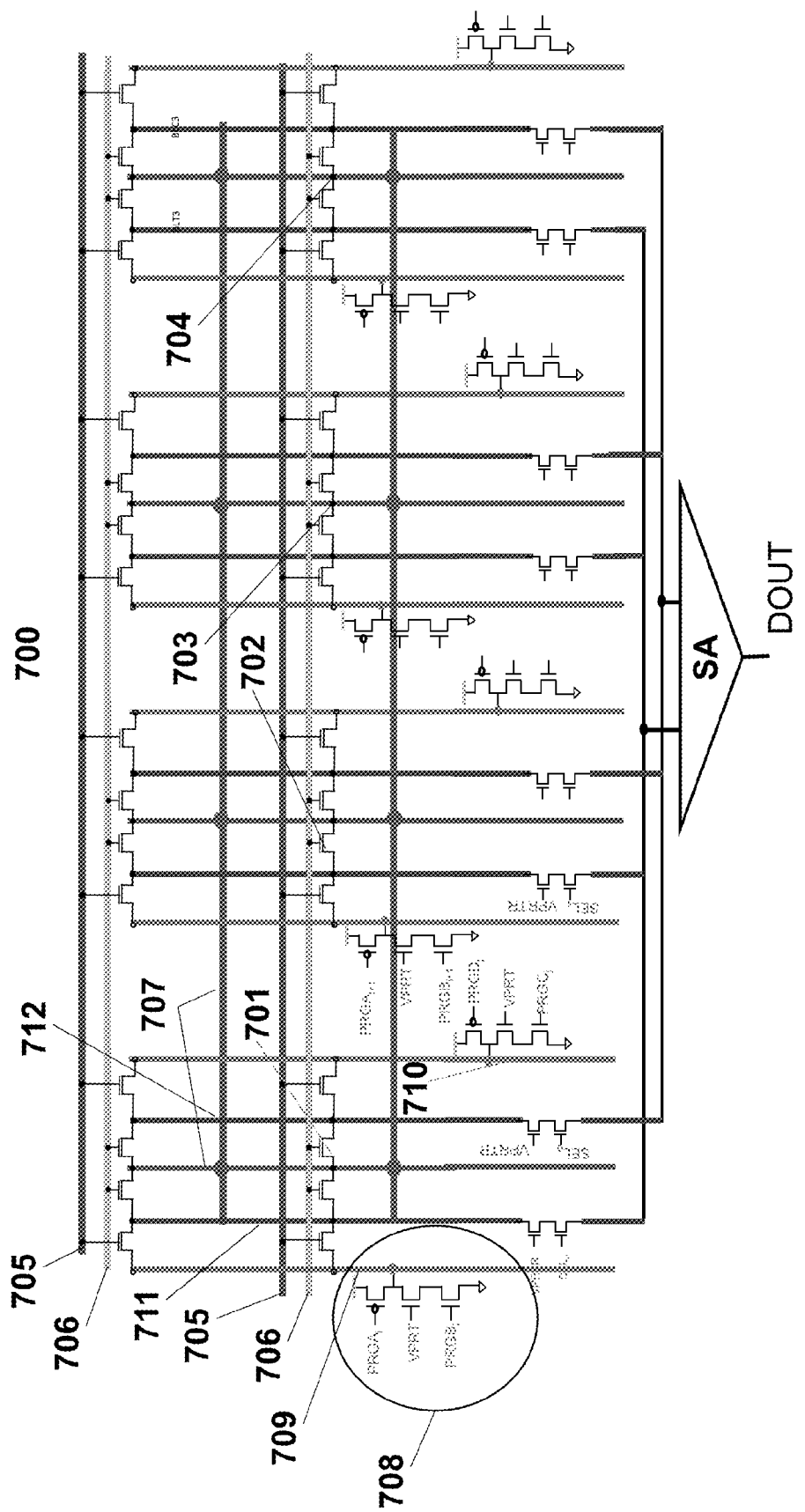
FIG. 7 shows a schematic diagram of an IC structure of an MTPM array according to embodiments of the present disclosure.

Referring to FIG. 7, an MTPM Array 700 with a 4×1 arrangement is shown according to an embodiment of the present disclosure. This is a general embodiment of a 4×1 array structure with four twin-cell transistor pair sets. Though 4×1 architecture is shown here, it could be extended to other multiplexing schemes. Shown is a first set of twin-cell pairs 701, a second set of twin-cell pairs 702, a third set of twin-cell pairs 703, and a fourth set of twin-cell pairs 704. These four pairs of twin-cells can be seen utilizing common WLs. The first twin-cell pair 701 utilizes a true bitline 711, a complementary bitline 712, a first wordline 705, a second wordline 706 and a common second sourceline 707. The same holds true for other three twin-cell pairs. The SL driver circuits 708 are operating on a first sourceline 709, and a third sourceline 710, and are performing the functions that would have been performed conventionally by the BL drivers. For example, in a programming operation of the first twin-cell resistor pair 701 the first sourceline 709 should be set high (e.g., 1.5 V) and the second sourceline 707 set to ground and the third source line 710 is set of float in order to pull the floating true bitline 711 to ground. Inactive WLs along the column are pulled high to VDD voltage to enable the redistribution of programming current. This is a change from the conventional architecture where the BLs are set to ground in the programming operation via a BL driver. In order to compensate for this lack of the conventional BL driver, the additional SL driver circuits 708 attached to the first sourceline 710 and the second sourceline 710 will perform their task.

Figure 8:
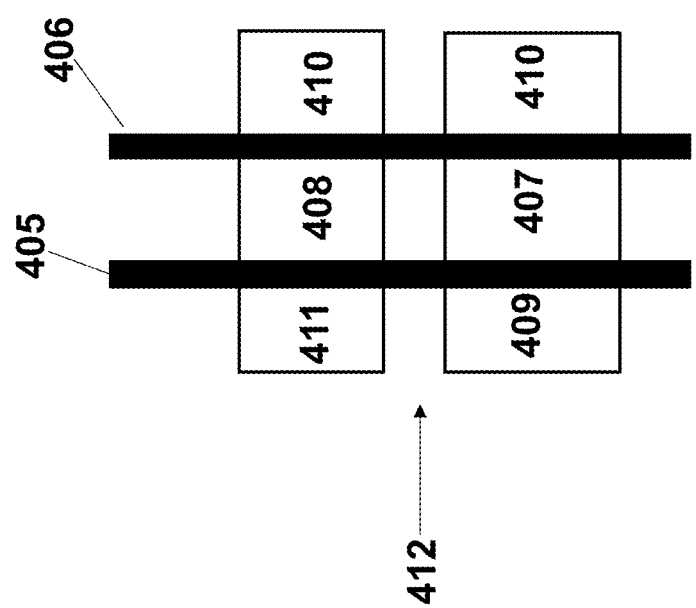
FIG. 8 shows a physical design or layout of an IC structure according to embodiments of the present disclosure.

Referring to FIG. 8, a MTPM 412 utilizing twin-cell architecture and a layout with a 1-finger configuration for WL is shown according to an embodiment of the present disclosure. In this embodiment, MTPM 412 utilizes 1-fingered WLs, a first wordline 405, and a second wordline 406. The configuration of MTPM 412 comprising of a complement bitline 408, a true bitline 407, a first sourceline 409, a pair of second sourcelines 410, and a third sourceline 411. This proposed practical track layout illustrates to one skilled in the art alternate approaches to utilize this invention, as one would in conventional transistor device structuring. MTPM 412 is just one example embodiment, and in no way should this illustration limit this disclosure from being applied in other configurations.

Figure 9:
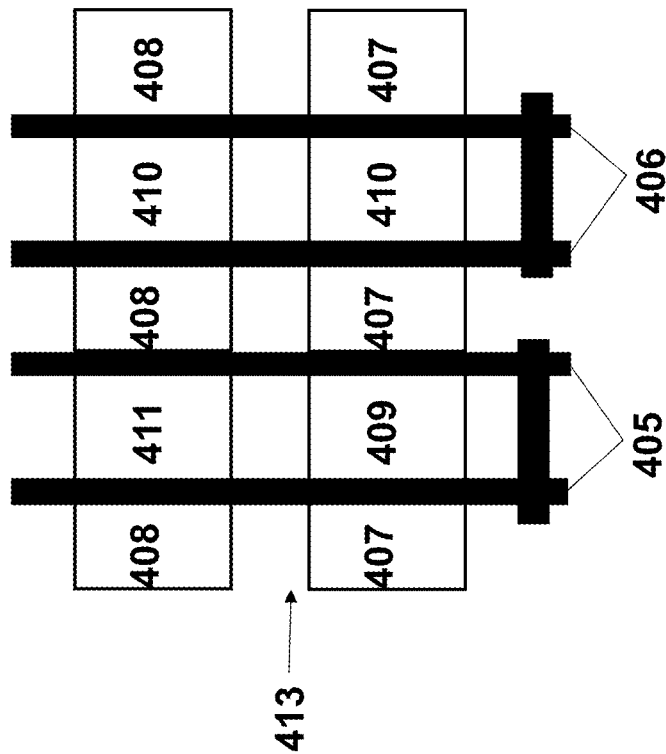
FIG. 9 shows a physical design or layout of an IC structure according to an alternative embodiment of the present disclosure.

Referring to FIG. 9, a MTPM 413 utilizing twin-cell architecture and a layout with a two-finger configuration for WLs are shown according to an embodiment of the present disclosure. This embodiment of the invention utilizes two-fingered wordlines, a first wordline 405, a second wordline 406, a set of three complement bitlines 408, three true bitlines 407, a first sourceline 409, a pair of second sourcelines 410, and a third sourceline 411. This proposed practical track layout also illustrates to one skilled in the art alternate approaches to utilize this invention, as one would in conventional transistor device structuring. MTPM 413 is just one example embodiment, and in no way should this illustration limit this disclosure from being applied in other configurations.

Referring to FIG. 10, a MTPM 700 utilizing twin-cell architecture is shown according to an embodiment of the present disclosure. There is a series of cells of at least four transistors 701. The series may include a first cell A, a second cell B, a third cell C and a fourth cell D. This series of cells may form twin-cells, a first twin-cell 706 formed by the first cell A and the fourth cell D being source-drain coupled by a first sourceline 707, and a second twin-cell 708 formed by the second cell B and the third cell C being drain-source-coupled by a second sourceline 709. In this embodiment, a pair of twin-cells 701 are able to store two bits of information, and each MOSFET is driven by a separate wordline. A first wordline 712 is gate-coupled to the first cell A, a second wordline 713 is gate-coupled to the second cell B, a third wordline 714 is gate-coupled to the third cell C, and a fourth wordline 715 is gate-coupled to the fourth cell D. The node between the first cell A and the second cell B is either source or drain coupled to a true bitline 710, and the node between the third cell C and the fourth cell D 705 is either source or drain coupled to a complement bitline 711. In the present embodiment, MTPM 700 is thus composed of four tracks, the true bitline 710, the complement bitline 711, the first sourceline 707, and the second sourceline 709. Additionally, there is programming symmetry due to the balanced nature of this embodiment.

Referring to FIG. 11, a table of program settings according to an embodiment of the present disclosure is shown. MTPM 700 performs a programming operation in the first cell A 702 in response to a first voltage (e.g., 1.5 V) applied to the first sourceline 707, a first VPP (e.g., 2 V) being applied to the first wordline 712 and the fourth wordline 715 (the twin-cell pairs), and a first VDD being applied to the second wordline 713, with the third wordline 714 and the second sourceline 709 to ground, while the true bitline 710 and complement bitline 711 are set to float.

These substituted twin-pair sets will improve programming efficiency VGS and VDS through a lowering of IR drop and VDS drops at the BL write driver. The lowering of the IR and VDS drops allow the array to be reconfigured to have more WLs and fewer BLs resulting in significant area savings as the WL driver area is smaller than the BL write driver area. These area savings are due to the structural changes in the construction of the array resulting in lowered BL drop that allows for the inclusion of more WL per area density, and will allow for either extraction of the Amory cell to a larger array, or in an array of the same size but with increased programming operation efficiency.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Illustrative voltages are described, but can vary such they may be +/−25% of the demonstrative values given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A Multi-Time Programmable Memory (MTPM) device comprising:
   a first pair of twin-cell Metal-Oxide-Semiconductor Field-Effect-Transistors (MOSFETs) gate-coupled to a first wordline and a second pair of twin-cell MOSFETs gate-coupled to a second wordline;
   a true bitline drain-coupled to a first MOSFET in the first pair and source-coupled to a first MOSFET in the second pair;
   a complementary bitline drain-coupled to a second MOSFET in the second pair and source-coupled to a second MOSFET in the first pair;
   a first sourceline source-coupled to the first MOSFET in the first pair;
   a second sourceline drain-coupled to the first MOSFET in the second pair and source-coupled to the second MOSFET in the second pair; and
   a third sourceline drain-coupled to the second MOSFET in the first pair.

2. The MTPM device of claim 1, wherein the MTPM device performs a programming operation for the first MOSFET in the first twin-cell pair, in response to:
   a first predetermined voltage being applied to the first wordline, a second predetermined voltage being applied to the second wordline, a third predetermined voltage being applied to the first sourceline;
   the second sourceline being set to ground; and
   the third sourceline, the true bitline and the complementary bitline being set to float.

3. The MTPM device of claim 2, wherein the first predetermined voltage is about 2V, the second predetermined voltage is about 0.8V, and the third predetermined voltage is about 1.5V.

4. The MTPM device of claim 1, wherein the MTPM device performs a read operation in response to:
   a first predetermined voltage being applied to the first wordline;
   the second wordline, the first sourceline and the third sourceline being set to ground;
   the second sourceline being set to float; and
   the true bitline and the complementary bitline operating in sense.

5. The MTPM device of claim 4, wherein the first predetermined voltage is about 0.5V.

6. The MTPM device of claim 1, wherein the MTPM device performs an erase operation in response to:
   setting the first wordline and the second wordline to ground;
   setting the first sourceline, the second sourceline and the third sourceline to float; and
   applying a set voltage to the true bitline and the complementary bitline.

7. The MTPM device of claim 1, wherein an inactive portion of the MTPM array is reused to distribute the BL current during programming, thereby mimicking a BL driver functionality, and reducing the BL wire drop.

8. A Multi-Time Programmable Memory (MTPM) device comprising:
   a first pair of twin-cell MOSFETs coupled to a first sourceline, wherein the first sourceline is source-coupled to a first MOSFET in the first pair and is further drain-coupled to a second MOSFET in the first pair;
   a second pair of twin-cell MOSFETs coupled to a second sourceline, wherein the second sourceline is drain-coupled to a first MOSFET in the second pair and is further source-coupled to a second MOSFET in the second pair;
   a first wordline gate-coupled to the first MOSFET in the first pair;
   a second wordline gate-coupled to the first MOSFET in the second pair;
   a third wordline gate-coupled to the second MOSFET in the second pair;
   a fourth wordline gate-coupled to the second MOSFET in the first pair;
   a true bitline drain-coupled to the first MOSFET in the first pair and source-coupled to the first MOSFET in the second pair, wherein the true bitline is set to float; and
   a complementary bitline drain-coupled to the second MOSFET in the second pair and source-coupled to the second MOSFET in the first pair, wherein the complementary bitline is set to float.

9. The MTPM device of claim 8, wherein:
   the first wordline is gate-coupled to only the first MOSFET in the first pair;
   the second wordline gate-coupled to only the first MOSFET in the second pair;
   the third wordline gate-coupled to only the second MOSFET in the second pair;
   the fourth wordline gate-coupled to only the second MOSFET in the first pair.

10. The MTPM device of claim 8, wherein the MTPM device performs a programming operation for the first MOSFET in the first twin-cell pair, in response to:
   a first predetermined voltage being applied to the first wordline and the fourth wordline, a second predetermined voltage being applied to the second wordline, the third wordline set to ground, a third predetermined voltage on the first sourceline, and the second sourceline set to ground; and
   the true bitline and the complementary bitline being set to float.

11. The MTPM device of claim 10, wherein the first predetermined voltage is about 2V, the second predetermined voltage is about 0.8V, and the third predetermined voltage is about 1.5V.

12. The MTPM device of claim 8, wherein the MTPM device performs an erase operation in response to:
the first wordline, the second wordline, the third wordline and the fourth wordline being set to ground;
setting the first sourceline and the second sourceline to float; and
applying a set voltage to the true bitline and the complementary bitline.

13. The MTPM device of claim 8, wherein an inactive portion of the MTPM array is reused to distribute the BL current during programming, thereby mimicking a BL driver functionality, and reducing the BL wire drop.

14. A MTPM Matrix array comprising of an array of paired twin-cell devices, each paired twin-cell device comprising:
a first pair of twin-cell Metal-Oxide-Semiconductor Field-Effect-Transistors (MOSFETs) gate-coupled to a first wordline and a second pair of twin-cell MOSFETs gate-coupled to a second wordline;
a true bitline drain-coupled to a first MOSFET in the first pair and source-coupled to a first MOSFET in the second pair;
a complementary bitline drain-coupled to a second MOSFET in the second pair and source-coupled to a second MOSFET in the first pair;
a first sourceline source-coupled to the first MOSFET in the first pair;
a second sourceline drain-coupled to the first MOSFET in the second pair and source-coupled to the second MOSFET in the second pair; and
a third sourceline drain-coupled to the second MOSFET in the first pair.

15. The MTPM Matrix array of claim 14, wherein the MPTPM Matix array performs a programming operation for the first MOSFET in the first twin-cell pair, in response to:
a first predetermined voltage being applied to the first wordline, a second predetermined voltage being applied to the second wordline, a third predetermined voltage being applied to the first sourceline;
the second sourceline being set to ground; and
the third sourceline, the true bitline and the complementary bitline being set to float.

16. The MTPM Matrix array of claim 15, wherein the first predetermined voltage is about 2V, the second predetermined voltage is about 0.8V, and the third predetermined voltage is about 1.5V.

17. The MTPM Matrix array of claim 14, wherein the MTPM device performs a read operation in response to:
a first predetermined voltage being applied to the first wordline;
the second wordline, the first sourceline and the third sourceline being set to ground;
the second sourceline being set to float; and
the true bitline and the complementary bitline operating in sense.

18. The MTPM Matrix array of claim 17, wherein the first predetermined voltage is about 0.5V.

19. The MTPM Matrix array of claim 14, wherein the MTPM device performs an erase operation in response to:
setting the first wordline and the second wordline to ground;
setting the first sourceline, the second sourceline and the third sourceline to float; and
applying a set voltage to the true bitline and the complementary bitline.

20. The MTPM Matrix of claim 14, wherein an inactive portion of the MTPM array is reused to distribute the BL current during programming, thereby mimicking a BL driver functionality, and reducing the BL wire drop.

\* \* \* \* \*